(12) United States Patent
Liu

(10) Patent No.: US 7,593,254 B2
(45) Date of Patent: Sep. 22, 2009

(54) VARIABLE RESISTANCE MEMORY DEVICE WITH AN INTERFACIAL ADHESION HEATING LAYER, SYSTEMS USING THE SAME AND METHODS OF FORMING THE SAME

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 293 days.

(21) Appl. No.: 11/754,001

(22) Filed: May 25, 2007

(65) Prior Publication Data

US 2008/0291718 A1    Nov. 27, 2008

(51) Int. Cl.
*G11C 11/00*    (2006.01)
(52) U.S. Cl. ........................ 365/163; 365/158; 365/171; 365/173
(58) Field of Classification Search ................. 365/163, 365/158, 171, 173
See application file for complete search history.

(56) References Cited

U.S. PATENT DOCUMENTS

| | | | | |
|---|---|---|---|---|
| 6,549,447 | B1 * | 4/2003 | Fricke et al. | 365/105 |
| 6,778,420 | B2 * | 8/2004 | Parkinson | 365/100 |
| 2007/0007613 | A1 | 1/2007 | Wang et al. | |

FOREIGN PATENT DOCUMENTS

WO    WO-2007/148405    12/2007

* cited by examiner

*Primary Examiner*—Pho M. Luu
(74) *Attorney, Agent, or Firm*—Dickstein Shapiro LLP

(57) ABSTRACT

A variable resistance memory element and method of forming the same. The memory element includes a first electrode, a resistivity interfacial layer having a first surface coupled to said first electrode; a resistance changing material, e.g. a phase change material, having a first surface coupled to a second surface of said resistivity interfacial layer, and a second electrode coupled to a second surface of said resistance changing material.

27 Claims, 7 Drawing Sheets

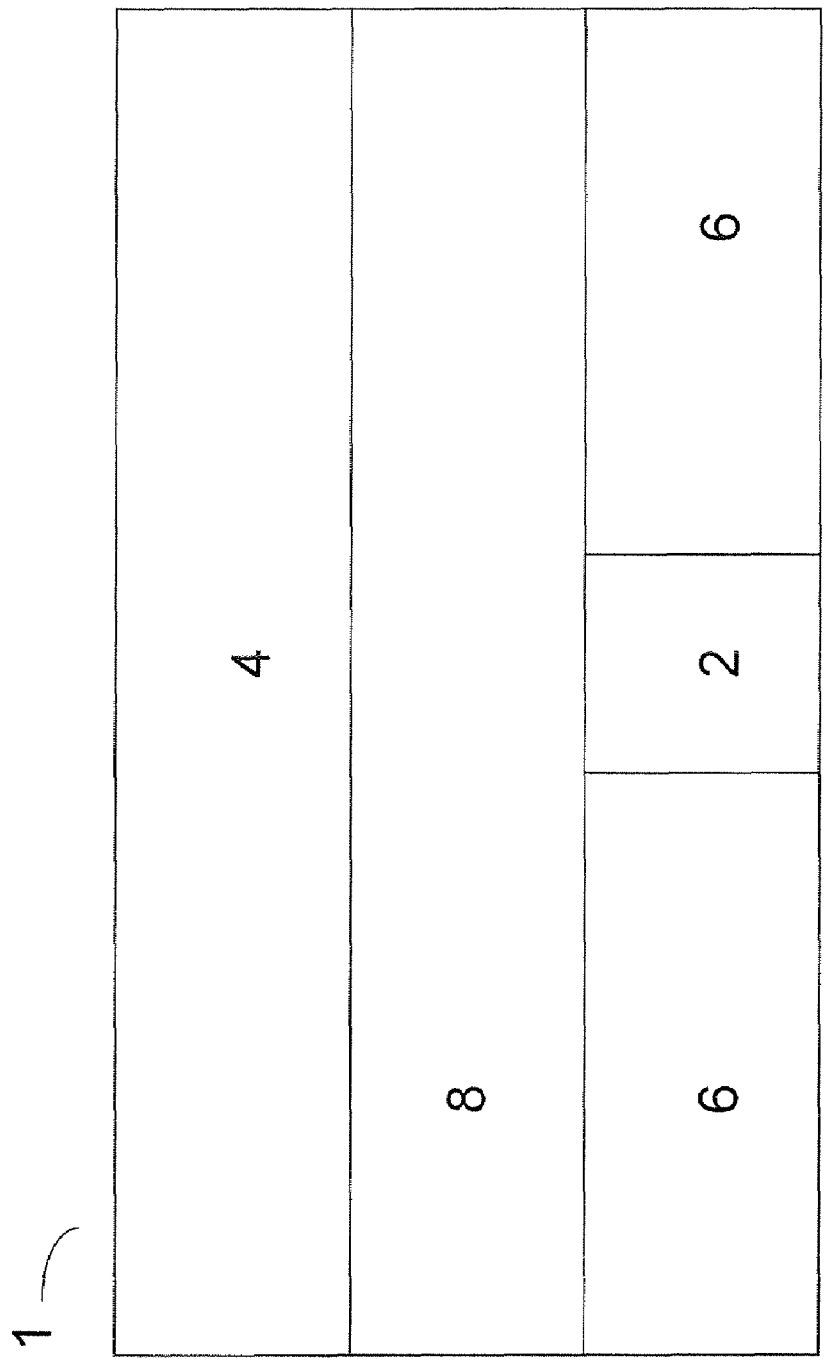

VARIABLE RESISTANCE MEMORY DEVICE WITH AN INTERFACIAL ADHESION HEATING LAYER, SYSTEMS USING THE SAME AND METHODS OF FORMING THE SAME

FIELD OF THE INVENTION

Embodiments of the invention relate to semiconductor devices and, in particular, to variable resistance memory elements and methods of forming the same.

BACKGROUND OF THE INVENTION

Non-volatile memories are useful storage devices due to their ability to maintain data absent a power supply. One class of variable resistance materials for use in non-volatile memory cells are phase change materials, such as chalcogenide alloys, which are capable of stably transitioning between amorphous and crystalline phases. Each phase exhibits a particular resistance state and the resistance states distinguish the logic values of a memory element formed with such materials Specifically, an amorphous state exhibits a relatively high resistance, and a crystalline state exhibits a relatively low resistance.

A conventional variable resistance memory implemented as phase change memory element 1, is illustrated in FIGS. 1A and 1B, and often has a layer of phase change material 8 between first and second electrodes 2, 4. The first electrode 2 is arranged within a dielectric material 6. The phase change material 8 is set to a particular resistance state according to the amount of current applied between the first and second electrodes 2, 4. To obtain an amorphous state (FIG. 1B), a relatively high write current pulse (a RESET pulse) is applied for a first period of time through the phase change memory element 1 to melt at least a portion 9 of the phase change material 8 covering the first electrode 2. The current is removed and the phase change material 8 cools rapidly to a temperature below the crystallization temperature, which results in the portion 9 of the phase change material 8 covering the first electrode 2 having the amorphous state. To obtain a crystalline state (FIG. 1A), a lower current write pulse (a SET pulse) is applied to the phase change memory element 1 for a second period of time (typically longer in duration than the first period of time and the crystallization time of the amorphous phase change material) to heat the amorphous portion 9 to a temperature below its melting point, but above its crystallization temperature. This causes the amorphous portion 9 of the phase change material 8 to re-crystallize to the crystalline state that is maintained once the current is removed and the phase change memory element 1 is cooled. The phase change memory element 1 is read by applying a read voltage, which does not change the phase state of the phase change material 8.

Due to the low resistivity of crystalline phase change material, a large RESET current density may be required to provide sufficient power to melt the phase change material. A large current density may cause undesired electro-migration in conductive material and may cause phase separation in the phase change material. Additionally, weak adhesion between the phase change material and other layers may introduce long term reliability issues in the phase change memory element.

BRIEF DESCRIPTION OF THE DRAWINGS

FIGS. 1A and 1B illustrate a conventional phase change memory element.

DETAILED DESCRIPTION OF THE INVENTION

Figure 1B:
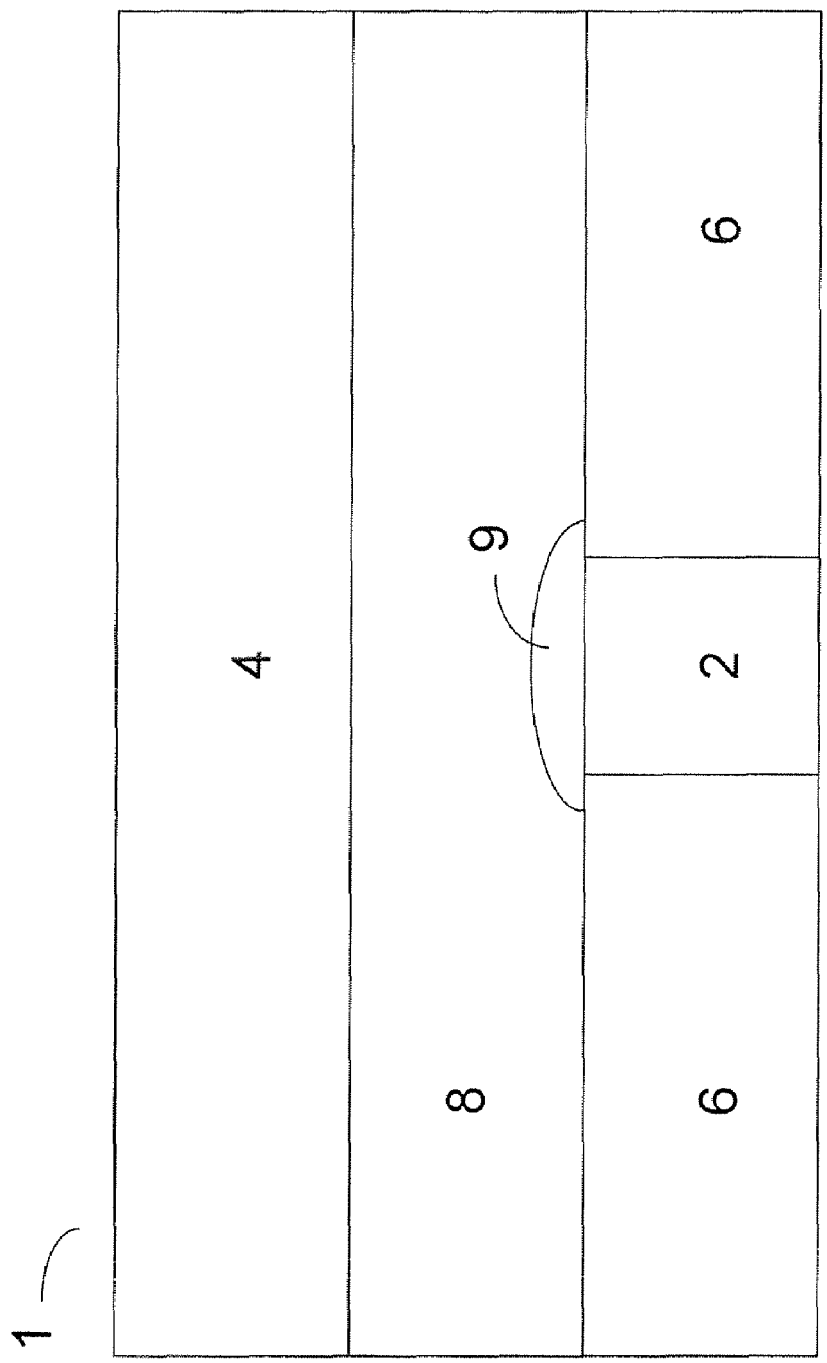

In the following detailed description, reference is made to various embodiments. These embodiments are described with sufficient detail to enable those skilled in the art to practice them. It is to be understood that other embodiments may be employed, and that various structural, logical and electrical changes may be made.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate or wafer in the following description, previous process steps may have been utilized to form regions or junctions in or over the base semiconductor or foundation. The substrate also need not be semiconductor-based, but may be any support structure suitable for supporting an integrated circuit, including, but not limited to, metals, alloys, glasses, polymers, ceramics, and any other supportive materials as is known in the art.

As discussed above, variable resistance memory devices that include phase change memory elements use the self-heating of phase change material to induce phase change between amorphous and crystalline states. Due to the low resistivity of crystalline phase change material, a large RESET current density may be required to provide sufficient power to melt the phase change material. A large current density may cause undesired electro-migration in conductive material and may cause phase separation in the phase change material. Additionally, weak adhesion between the phase change material and other layers may introduce long term reliability issues in the phase change memory element. High temperature cycling and heat-induced volume change and stress may exacerbate the problem.

Embodiments disclosed herein provide a phase change memory device that includes an interfacial adhesion heating layer arranged between an electrode and the phase change material. The interfacial adhesion heating layer improves the adhesion between a dielectric layer and the phase change material and also serves as a localized heating element to provide additional heating to the phase change material to aid in its own self-heating. The additional heating from the interfacial adhesion heating layer can reduce the RESET current needed to induce phase change by more than thirty times, while maintaining a device off/on resistance ratio larger than one hundred, which is desirable. The device off/on resistance ratio refers to the ratio of the resistance in the off state, in which a portion of the phase change material is in an amorphous state to the resistance in the on state, in which the phase change material is in a crystalline state. By reducing the RESET current density, undesired electro-migration in conductive material and phase separation in the resistance variable material may be avoided. Furthermore, a heat sink effect may be alleviated due to lower thermal conductivity of the interfacial adhesion heating layer.

Figure 2:
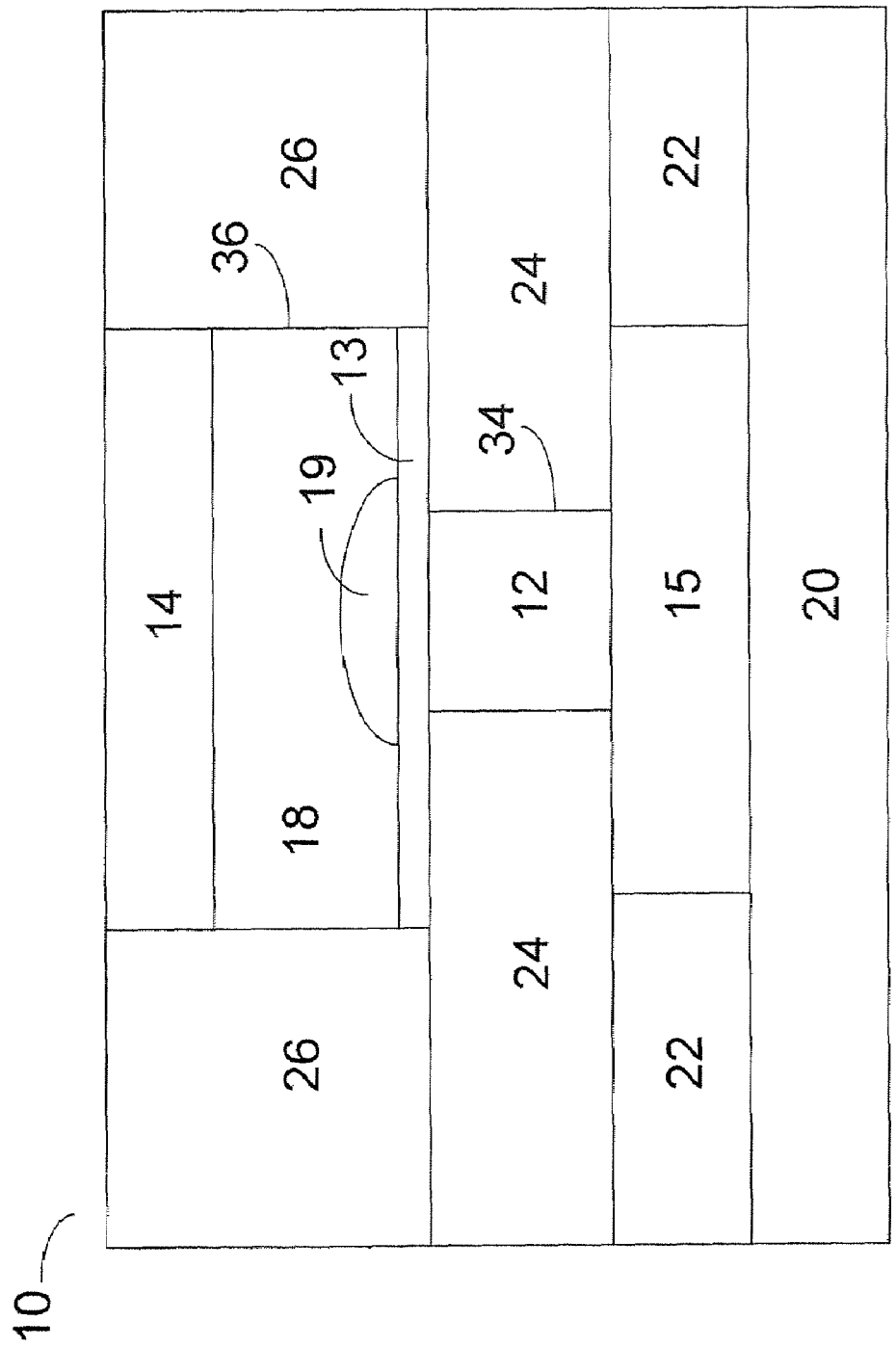
FIG. 2 illustrates a partial cross-sectional view of a phase change memory element according to an embodiment of the invention.

Embodiments are now explained with reference to the figures, in which like reference numbers indicate like features. FIG. 2 illustrates a partial cross-sectional view of a phase change memory element 10 constructed in accordance with an embodiment of the invention. The memory element 10 may store at least one bit, i.e., logic 1 or 0.

The memory element 10 is supported by a substrate 20. A first dielectric layer 22 is arranged on the substrate 20, and a first conductive metal layer 15 is arranged within the first dielectric layer 22. The conductive metal layer 15 may be formed of any suitable conductive material, such as titanium-nitride (TiN), titanium-aluminum-nitride (TiAlN), titanium-tungsten (TiW), platinum (Pt) or tungsten (W), among others. The thickness of the conductive metal layer 15 may vary. In one embodiment, the conductive metal layer 15 may be about 1000 Å thick.

A second dielectric layer 24 is arranged on the first dielectric layer 22 and a bottom electrode 12 is arranged within the second dielectric layer 24. The bottom electrode 12 may be formed of any suitable conductive material, such as titanium-nitride (TiN), titanium-aluminum-nitride (TiAlN), titanium-tungsten (TiW), platinum (Pt) or tungsten (W), among others. The bottom electrode 12 may be scaled down in size to reduce the required programming current. The thicknesses of the variable resistance material layer 18 and the top electrode 14 may also be scaled down in size to correspond in size to the bottom electrode 12. In one embodiment, the bottom electrode 12 may be a plug bottom electrode and may be about 700 Å in height and may have a diameter of about 400 Å or less. In other embodiments, the bottom electrode 12 may be a different type of electrode, such as an annular ring electrode or a liner electrode.

A third dielectric layer 26 is arranged on the second dielectric layer 24. An interfacial adhesion heating layer 13 is arranged on the bottom electrode 12 and the second dielectric layer 24 within an opening 36 in the third dielectric layer 26. The interfacial adhesion heating layer 13 may be formed of a material that will improve adhesion between a variable resistance material layer 18 and the second dielectric layer 24 and/or will provide resistivity sufficient to provide a localized heating effect, such as N-rich TaN, N-rich TiAlN, AlPdRe, HfTe$_5$, TiNiSn, PBTe, Bi$_2$Te$_3$, Al$_2$O$_3$, A-C, TiO$_x$N$_y$, TiAl$_x$O$_y$, SiO$_x$N$_y$, or TiO$_x$, among others. N-rich TaN is TaNx, where x is larger than 1. N-rich TaN can be created by increasing the flow rate of N$_2$ in proportion to the flow rate of Ar during TaN sputtering. The value of x in TaNx may be varied according to the application requirement. A larger amount of N in TaNx results in a higher resistivity. N-rich TiAlN is TiAlNx, where x is larger than 1. N-rich TiAlN can be produced in a manner similar to N-rich TaN.

In one embodiment, the thickness of the interfacial adhesion heating layer 13 may range between about 5 Å to about 50 Å. In another embodiment, the thickness of the interfacial adhesion heating layer 13 may range between about 20 Å to about 50 Å.

A variable resistance material layer 18 is arranged on the interfacial adhesion heating layer 13 within the opening 36 in the third dielectric layer 26. In the illustrated embodiment, the variable resistance material layer 18 is a chalcogenide material, such as, for example, germanium-antimony-telluride, Ge$_2$Sb$_2$Te$_5$ (GST). The phase change materials can also be or include other phase change materials, for example, In—Se, Sb2Te3, GaSb, InSb, As—Te, Al—Te, GeTe, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt. FIG. 2 shows the phase change memory element 10 in a state in which the variable resistance material layer 18 has a portion 19 that is in the amorphous state, while the rest of the variable resistance material layer 18 is in the crystalline state. In one embodiment, the variable resistance material layer 18 may be about 800 Å thick.

A top electrode 14 is arranged on the variable resistance material layer 18 within the opening 36 in the third dielectric layer 26. The top electrode 14 may be formed of any suitable conductive material, such as titanium-nitride (TiN), titanium-aluminum-nitride (TiAlN), titanium-tungsten (TiW), platinum (Pt) or tungsten (W), among others. The interfacial adhesion heating layer 13, the variable resistance material layer 18 and the top electrode 14 are arranged within the opening 36 in the third dielectric layer 26, however, the top electrode 14 could also be arranged to extend over the top of the third dielectric layer 26. In one embodiment, the top electrode 14 may be about 600 Å thick.

The various dielectric layers 22, 24, 26, 27, 28 may be formed of an insulating material such as an oxide (e.g., SiO$_2$), silicon nitrides (SiN); alumina oxides; high temperature polymers; low dielectric materials; insulating glass; or insulating polymers. The dielectric material used to form the various dielectric layers 22, 24, 26, 27, 28 may be the same or different among the layers.

The interfacial adhesion heating layer 13 improves the adhesion between the second dielectric layer 24 and the variable resistance material layer 18 and may therefore improve long term reliability of the memory element 10, especially when high temperature cycling and heat-induced volume change and stress are integral aspects of the device processing or operating conditions. Additional benefits have been described above.

Figure 3A:
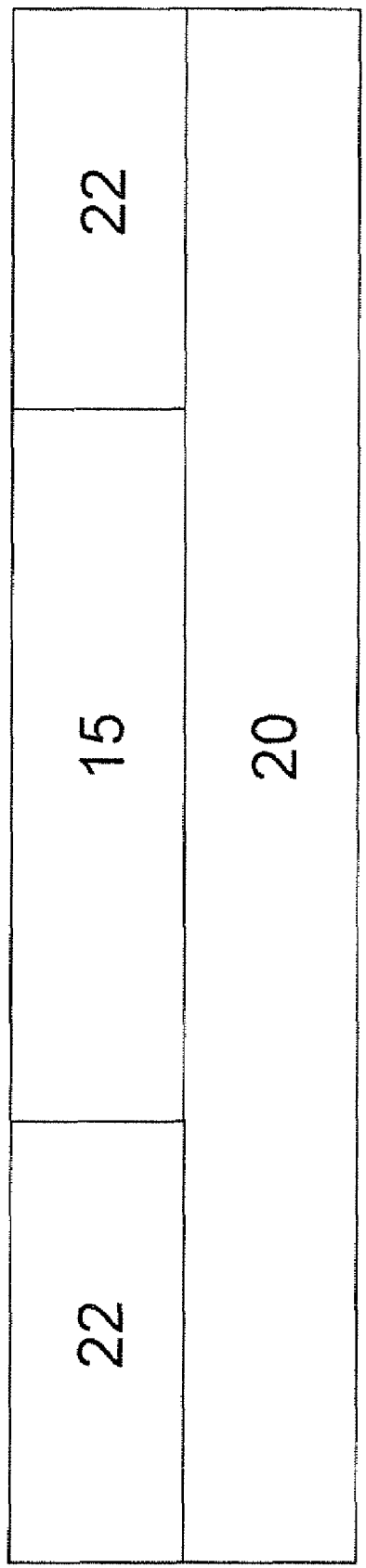
FIGS. 3A-3C illustrate partial cross-sectional views depicting a method of fabricating the phase change memory element of FIG. 2.
Figure 3B:
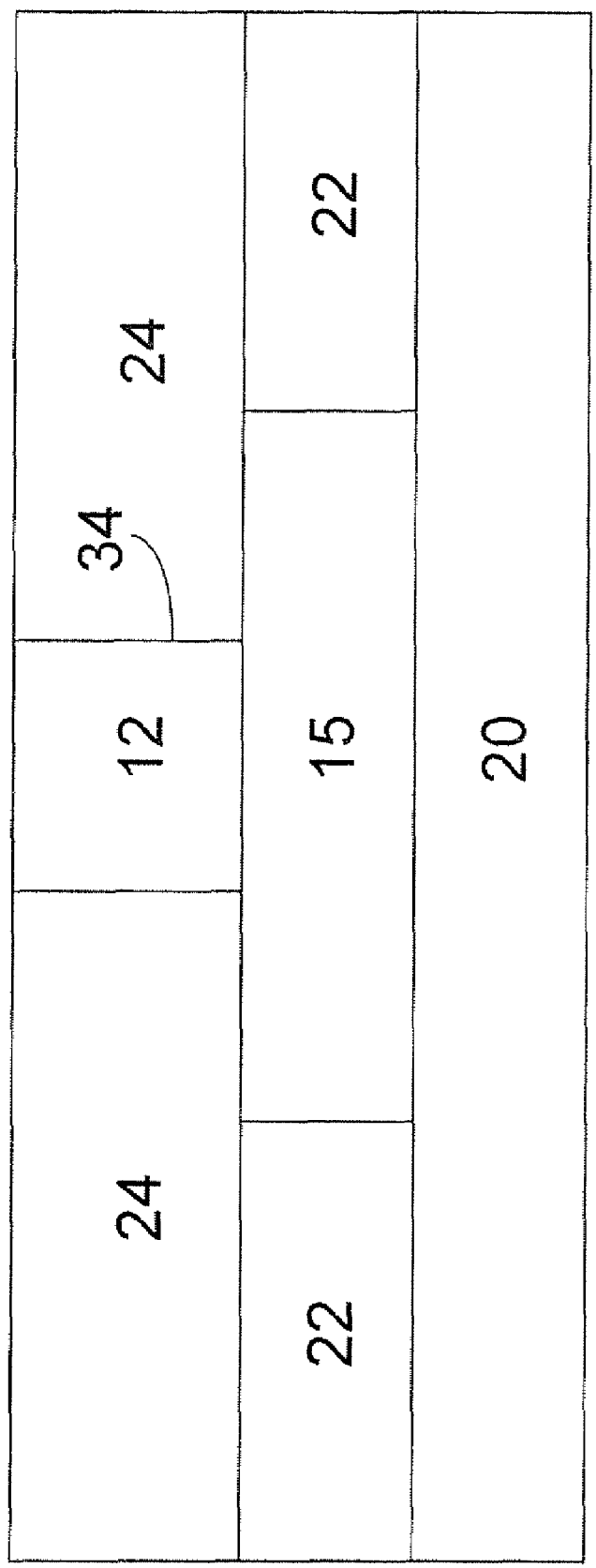
Figure 3C:
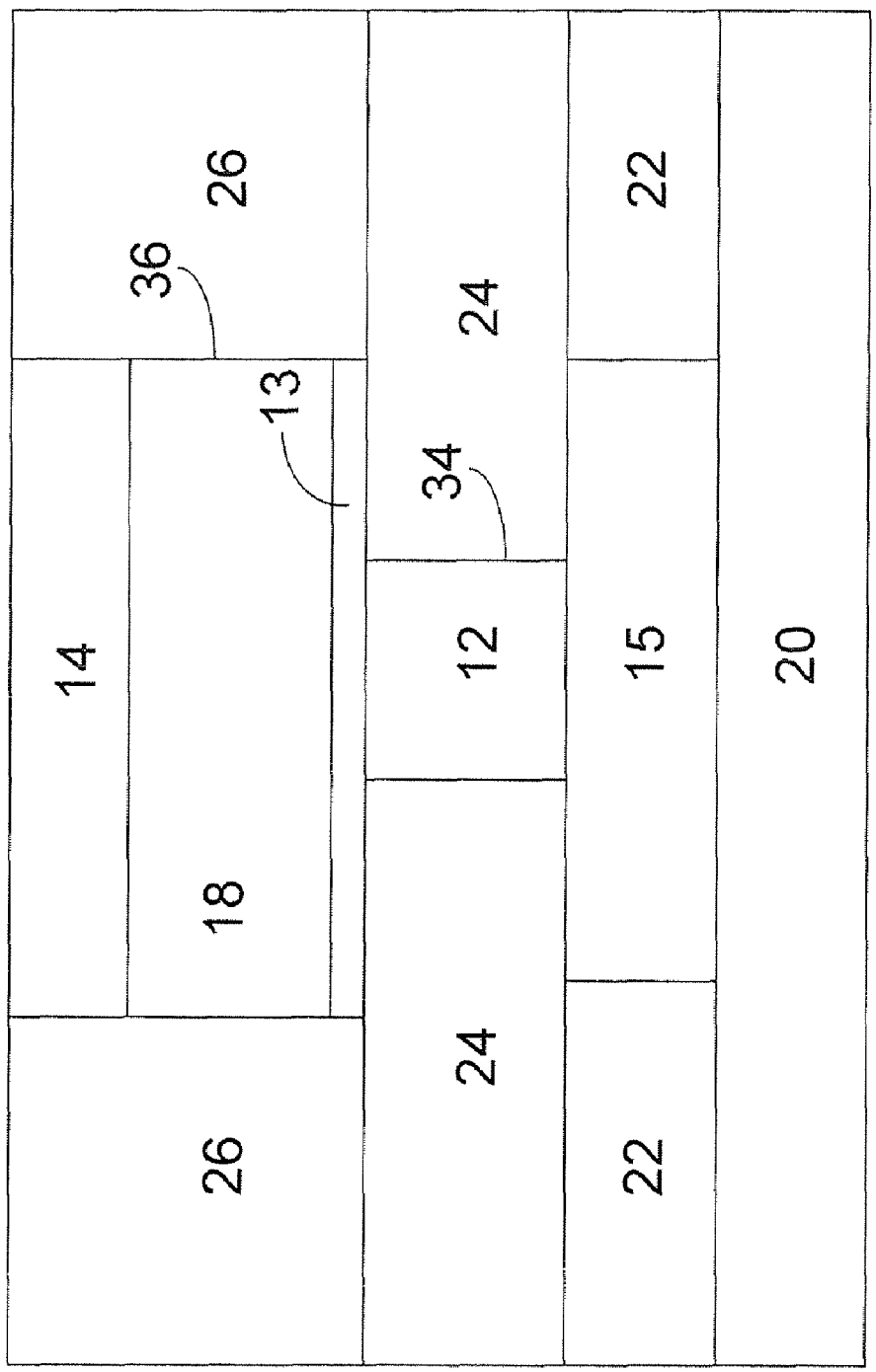

FIGS. 3A-3C illustrate one embodiment of a method of fabricating the phase change memory element 10 illustrated in FIG. 2. No particular order is required for any of the actions described herein, except for those logically requiring the results of prior actions. Accordingly, while the actions below are described as being performed in a specific order, the order can be altered if desired.

As shown in FIG. 3A, the first dielectric layer 22 is formed over a substrate 20 by any suitable technique. The first conductive metal layer 15 is formed within the first dielectric layer 22 using conventional photolithography, etching, blanket deposition, and chemical mechanical polishing (CMP) techniques.

As shown in FIG. 3B, the second dielectric layer 24 is formed over the first dielectric layer 22 and the first conductive metal layer 15. An opening 34 is formed in the second dielectric layer 24 over and aligned with the first conductive metal layer 15 by any suitable technique, for example, etching. The bottom electrode 12 is formed within the opening and in electrical contact with the first metal layer 15. Chemical mechanical polishing may be used to form a flat upper surface on the top surface of the bottom electrode 12.

As shown in FIG. 3C, the interfacial adhesion heating layer 13, the variable resistance material layer 18, and the top electrode 14 are sequentially deposited over the second dielectric layer 24 and the bottom electrode 12. The interfacial heating layer 13, the variable resistance material layer 18 and the top electrode 14 are then etched using a conventional photolithography and etching technique to form a stack. The third dielectric layer 26 is formed over the stack. A CMP technique may be used to expose the top electrode 14 and planarize the top electrode 14 and the top surface of dielectric layer 26.

EXAMPLE 1

The resistance of a memory element using a 1000 Å thick GST phase change material without an interfacial adhesion heating layer was computer modeled for the SET state. The c-GST layer had a resistivity of 7.5 milli-Ohms.cm. The top electrode was 1000 Å thick TiN. The bottom electrode was 1000 Å in height and 50 nm in diameter TiN. The resistance of the memory element in the SET state was approximately 200 Ohms.

EXAMPLE 2

The resistance of a memory element using a 1000 Å thick GST phase change material and having an interfacial adhesion heating layer was computer modeled for the SET state. The c-GST phase change material had a resistivity of 7.5 milli-Ohms.cm. The resistivity of a 20 Å thick interfacial adhesion heating layer was 7500 milli-Ohms.cm. The top electrode was 1000 Å thick TiN. The bottom electrode was 1000 Å in height and 50 nm in diameter TiN. The resistance of the memory element in the SET state was approximately 4,000 Ohms. The current density distribution showed little lateral current spread in the interfacial adhesion heating layer, while current distribution in the c-GST phase change material was similar to that of Example 1, indicating that the interfacial adhesion heating layer will not affect the shape of programming volume and will only provide localized heating above the bottom electrode. The interfacial adhesion heating layer also serves as a heat isolation layer to reduce heat loss due to its low thermal conductivity.

EXAMPLE 3

The resistance of a memory element using a 1000 Å thick GST phase change material without an interfacial adhesion heating layer was computer modeled for the RESET state. The resistivity of c-GST phase change material was 7.5 milli-Ohms.cm. The resistivity of a-GST phase change material was $7.5 \times 10^4$ milli-Ohms.cm. The top electrode was 1000 Å thick TiN. The bottom electrode was 1000 Å in height and 50 nm in diameter TiN. The resistance of the memory element in the RESET state was approximately $2 \times 10^6$ Ohms. The current density distribution mostly concentrated in a 300 Å a-GST region before it spread out.

EXAMPLE 4

The resistance of a memory element using a 1000 Å thick GST phase change material and having an interfacial adhesion heating layer was computer modeled for the RESET state. The resistivity of c-GST phase change material was 7.5 milli-Ohms.cm. The resistivity of a-GST phase change material was $7.5 \times 10^4$ milli-Ohms.cm. The resistivity of a 20 Å interfacial adhesion heating layer was 7500 milli-Ohms.cm. The top electrode was 1000 Å thick TiN. The bottom electrode was 1000 Å in height and 50 nm in diameter TiN. The resistance of the memory element in the RESET state was approximately $2 \times 10^5$ Ohms. Similar to example 3, the current density distribution mostly concentrated in a 300 Å a-GST region. The lateral current spread in the interfacial adhesion heating layer was small, leading to only a small cell resistance change.

EXAMPLE 5

Nanomechanical four point bending measurements were conducted by the inventor to determine the bonding strength between the various materials that may be used in the described embodiments. The results are included below in Table 1.

TABLE 1

| Materials Tested | Adhesion Energy (Gc) (J/m$^2$) |
|---|---|
| SiN/c-GST | 0.7 to 0.8 |
| TiN/c-GST | 2 to 3 |
| SiN/a-GST | 3 to 4 |
| TiN/a-GST | 13 to 14 |
| TiN/c-GST (DC sputtered) | 3.6 ± 1.1 |
| TiN/c-GST (RF sputtered) | 1.1 ± 0.4 |
| SiN/c-GST (heavy pre-sputter) | ~2.0-3.0 |
| TEOS/c-GST (heavy pre sputter) | ~2.0-3.0 |
| TiN/c-GST (RF sputtered) | ~1.0 |
| TEOS/a-GST (RF sputtered) | 0.2 |
| TEOS/c-GST (RF sputtered) | 0.3 |
| SiC/c-GST (RF sputtered) | very weak |
| DARC/c-GST (RF sputtered) | very weak |
| LSO/c-GST (RF sputtered) | 1.2 |
| Al2O3/c-GST | >1.5 |
| TEOS/c-GST | <0.5 |

FIG. 2 only depicts an example of a memory element 10 described herein. Other designs of the memory element 10 incorporating the interfacial adhesion heating layer 13 are possible. For example, the first metal layer 15 may be rearranged, omitted, or substituted as required for use in a particular memory device.

Embodiments may also employ one or more layers of other variable resistance materials as the variable resistance material layer 18. The thickness of the various layers may be modified as desired to account for various arrangements of the elements and desired resistances. Examples of other variable resistance materials include such as metal doped chalcogenide glass and those variable resistance materials discussed in various patents and patent applications assigned to Micron Technology, Inc., including, but not limited to the following: U.S. patent application Ser. No. 10/765,393; U.S. patent application Ser. No. 09/853,233; U.S. patent application Ser. No. 10/022,722; U.S. patent application Ser. No. 10/663,741; U.S. patent application Ser. No. 09/988,984; U.S. patent application Ser. No. 10/121,790; U.S. patent application Ser. No. 09/941,544; U.S. patent application Ser. No. 10/193,529; U.S. patent application Ser. No. 10/100,450; U.S. patent application Ser. No. 10/231,779; U.S. patent application Ser. No. 10/893,299; U.S. Pat. No. 10/077,872; U.S. patent application Ser. No. 10/865,903; U.S. patent application Ser. No. 10/230,327; U.S. patent application Ser. No. 09/943,190; U.S. patent application Ser. No. 10/622,482; U.S. patent application Ser. No. 10/081,594; U.S. patent application Ser. No. 10/819,315; U.S. patent application Ser. No. 11/062,436; U.S. patent application Ser. No. 10/899,010; and U.S. patent application Ser. No. 10/796,000, the disclosures of each of which are incorporated herein by reference.

Figure 4:
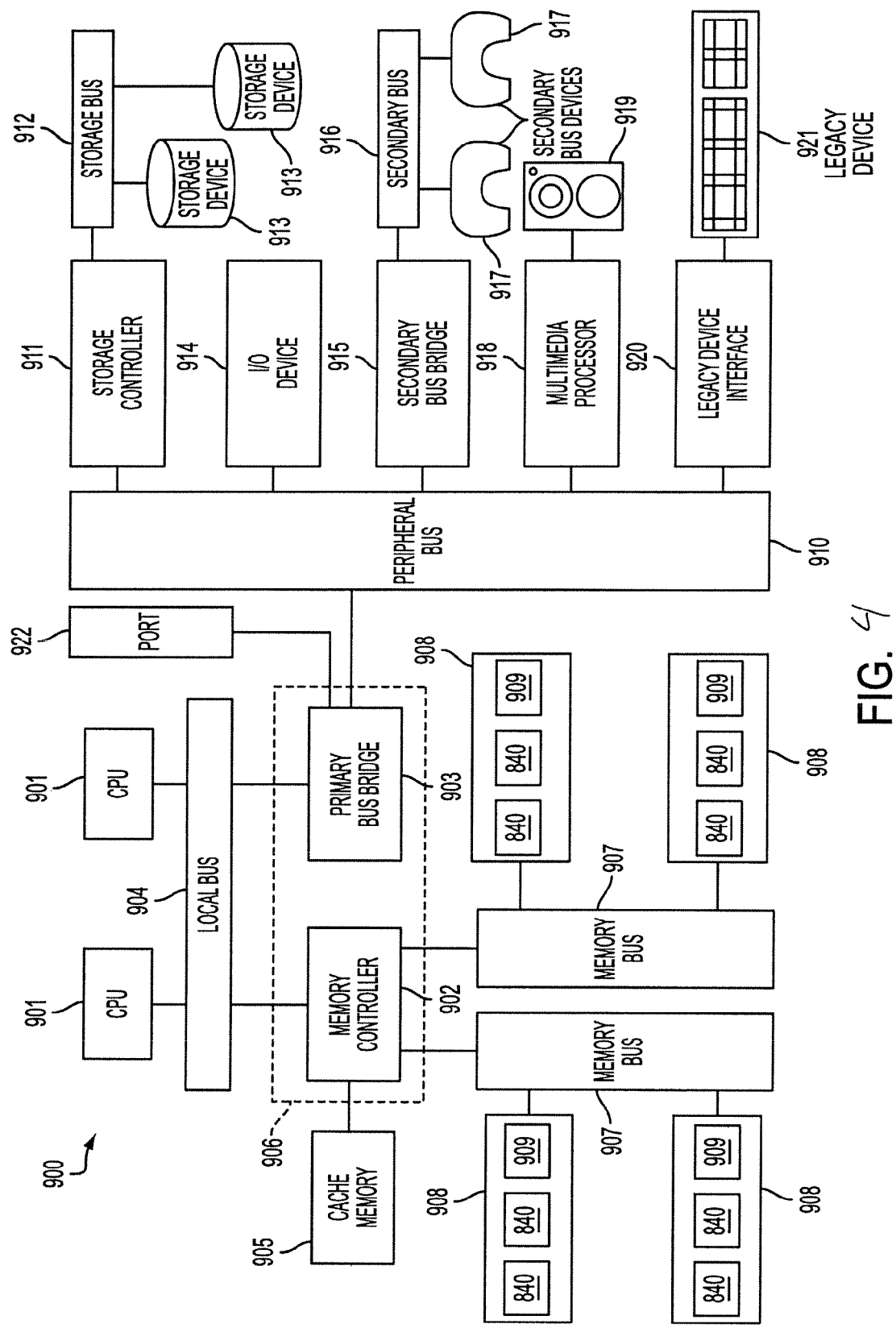
FIG. 4 is a block diagram showing an electronic system in block diagram form according to one aspect of the invention.

FIG. 4 illustrates an example processing system 900 that utilizes a resistance variable random access memory device 840 containing an array of memory elements 10 constructed as described above with reference to FIGS. 2 and 3A-3E. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908, which include at least one memory device 840 described herein. Alternatively, in a simplified system, the memory controller 902 may be omitted and the memory components directly coupled to one or more processors 901. The memory components 908 may be a memory card or a memory module. The memory components 908 may include one or more additional devices 909. For example, the additional device 909 might be a configuration memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also be coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge may be used to interface additional devices via another bus to the processing system. For example, the secondary bus bridge may be a universal serial bus (USB) port controller used to couple USB devices 917 to the processing system 900. The multimedia processor 918 may be a sound card, a video capture card, or any other type of media interface, which may also be coupled to additional devices such as speakers 919. The legacy device interface 920 is used to couple legacy devices 921, for example, older styled keyboards and mice, to the processing system 900.

The processing system 900 illustrated in FIG. 4 is only an example processing system with which embodiments described herein may be used. While FIG. 4 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory elements 10 (FIG. 2). These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The above description and drawings are only to be considered illustrative of specific embodiments, which achieve the features and advantages described herein. While embodiments described herein provide good adhesion between a GST material and an electrode and also reduce a RESET current, they also have applications to improve adhesion between layers in other variable resistance memory devices which use a chalcogenide, or other material, as the variable resistance material. Modification and substitutions to specific process conditions and structures can be made. Accordingly, the embodiments are not to be considered as being limited by the foregoing description and drawings, but are only limited by the scope of the appended claims.

What is claimed as new and desired to be protected by Letters Patent of the United States is:

1. A resistive memory device comprising:
   a first electrode;
   an interfacial adhesion heating layer having a first surface coupled to said first electrode;
   a resistance changing material having a first surface coupled to a second surface of said interfacial adhesion heating layer; and
   a second electrode coupled to a second surface of said resistance changing material.

2. The resistive memory device of claim 1, wherein said interfacial adhesion heating layer is formed of at least one material selected from the group consisting of TaN, TiAlN, AlPdRe, HfTe$_5$, TiNiSn, PBTe, Bi$_2$Te$_3$, Al$_2$O$_3$, A-C, TiO$_x$N$_y$, TiAl$_x$O$_y$, SiO$_x$N$_y$, and TiO$_x$.

3. The resistive memory device of claim 2, wherein said TaN is an N-rich TaN, and said TiAlN is an N-rich TiAlN.

4. The resistive memory device of claim 1, wherein said first surface of said interfacial adhesion heating layer is also coupled to a dielectric layer.

5. The resistive memory device of claim 4, wherein said dielectric layer comprises at least one of an oxide, a silicon nitride, an alumina oxide, a high temperature polymer, an insulating glass, and an insulating polymer.

6. The resistive memory device of claim 1, wherein said interfacial adhesion heating layer is about 5 angstroms to about 50 angstroms thick.

7. The resistive memory device of claim 1, wherein said resistance changing material comprises a GST material.

8. The resistive memory device of claim 1, further comprising a first conductive layer coupled to said first electrode and a second conductive layer coupled to said second electrode.

9. The resistive memory device of claim 1, wherein said first electrode and said second electrode comprise at least one of titanium-nitride, titanium-aluminum-nitride, titanium-tungsten, platinum, and tungsten.

10. A resistive memory device comprising:
    a first electrode;
    at least one dielectric material layer having an opening over said first electrode;
    an interfacial adhesion heating layer within said opening and in contact with said first electrode;
    a GST material layer within said opening and in contact with said interfacial adhesion heating layer; and
    a second electrode in contact with said GST material.

11. The resistive memory device of claim 10, wherein said second electrode is arranged within said opening.

12. The resistive memory device of claim 10, wherein said interfacial adhesion heating layer is formed of at least one material selected from the group consisting of N-rich TaN, N-rich TiAlN, AlPdRe, HfTe$_5$, TiNiSn, PBTe, Bi$_2$Te$_3$, Al$_2$O$_3$, A-C, TiO$_x$N$_y$, TiAl$_x$O$_y$, SiO$_x$N$_y$, and TiO$_x$.

13. The resistive memory device of claim 10, wherein said interfacial adhesion heating layer is about 5 angstroms to about 50 angstroms thick.

14. The resistive memory device of claim 10, wherein said interfacial adhesion heating layer is also coupled to a dielectric layer.

15. A resistive memory device comprising:
   a first electrode;
   an interfacial adhesion heating layer having a first surface in contact with said first electrode, said interfacial adhesion heating layer formed of at least one material selected from the group consisting of TaN, TiAlN, AlPdRe, HfTe$_5$, TiNiSn, PBTe, Bi$_2$Te$_3$, and Al$_2$O$_3$, A-C, TiO$_x$N$_y$, TiAl$_x$O$_y$, SiO$_x$N$_y$, and TiO$_x$,
   a GST material having a first surface in contact with a second surface of said interfacial adhesion heating layer; and
   a second electrode in contact with a second surface of said GST material.

16. The resistive memory device of claim 15, wherein said first electrode is surrounded by a dielectric layer and said interfacial adhesion heating layer is also coupled to said dielectric layer.

17. The resistive memory device of claim 16, wherein said dielectric layer comprises at least one of an oxide, a silicon nitride, an alumina oxide, a high temperature polymer, an insulating glass, and an insulating polymer.

18. The resistive memory device of claim 17, wherein said dielectric layer comprises SiN.

19. The resistive memory device of claim 15, wherein said interfacial adhesion heating layer is about 5 angstroms to about 50 angstroms thick.

20. A method of forming a memory element, the method comprising:
   forming a first electrode;
   forming an interfacial adhesion heating layer having a first surface coupled to the first electrode;
   forming a resistance changing material layer having a first surface coupled to a second surface of the interfacial adhesion heating layer; and
   forming a second electrode coupled to a second surface of the resistance changing material layer.

21. The method of claim 20, wherein a dielectric layer is formed around said interfacial adhesion heating layer, said resistance changing material layer, and said second electrode.

22. The method of claim 21, wherein said dielectric layer comprises at least one of an oxide, a silicon nitride, an alumina oxide, a high temperature polymer, an insulating glass, and an insulating polymer.

23. The method of claim 20, wherein said interfacial heating layer, said resistance changing material layer, and said second electrode are formed in a stack by depositing and etching an interfacial heating layer material, a resistance changing material, and a second electrode material.

24. The method of claim 20, wherein the interfacial adhesion heating layer is formed of at least one material selected from the group consisting of TaN, TiAlN, AlPdRe, HfTe$_5$, TiNiSn, PBTe, Bi$_2$Te$_3$, Al$_2$O$_3$, A-C, TiO$_x$N$_y$, TiAl$_x$O$_y$, SiO$_x$N$_y$, and TiO$_x$.

25. The method of claim 20, further comprising forming a dielectric layer around said first electrode, wherein said first surface of said interfacial adhesion heating layer is also coupled to said dielectric layer.

26. The method of claim 20, further comprising forming said interfacial adhesion heating layer to a thickness of about 5 angstroms to about 50 angstroms.

27. The method of claim 20, wherein said resistance changing material comprises a GST material.

* * * * *

UNITED STATES PATENT AND TRADEMARK OFFICE
CERTIFICATE OF CORRECTION

PATENT NO. : 7,593,254 B2  Page 1 of 1
APPLICATION NO. : 11/754001
DATED : September 22, 2009
INVENTOR(S) : Jun Liu It is certified that error appears in the above-identified patent and that said Letters Patent is hereby corrected as shown below:

In column 9, line 7, in Claim 12, delete "$TiO_x N_y$," and insert -- $TiO_xN_y$, --, therefor.

In column 9, line 21, in Claim 15, delete "$TiAl_x O_y$," and insert -- $TiAl_xO_y$, --, therefor.

Signed and Sealed this

Twenty-fourth Day of November, 2009

David J. Kappos
*Director of the United States Patent and Trademark Office*